United States Patent
Higashitani (10) Patent No.: US 7,923,767 B2
(45) Date of Patent: Apr. 12, 2011

(54) NON-VOLATILE STORAGE WITH SUBSTRATE CUT-OUT AND PROCESS OF FABRICATING

(75) Inventor: Masaaki Higashitani, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 196 days.

(21) Appl. No.: 11/964,445

(22) Filed: Dec. 26, 2007

(65) Prior Publication Data

US 2009/0166704 A1 Jul. 2, 2009

(51) Int. Cl.
*H01L 29/72* (2006.01)

(52) U.S. Cl. ........ 257/316; 257/314; 257/333; 257/401; 257/493; 257/496; 257/506; 257/622

(58) Field of Classification Search .................. 257/288, 257/314, 316, 333, 401, 493, 496, 506, 622
See application file for complete search history.

(56) References Cited

U.S. PATENT DOCUMENTS

| | | | |
|---|---|---|---|
| 5,488,244 A | 1/1996 | Quek | |
| 5,552,621 A | 9/1996 | Kowalski | |
| 6,440,817 B2 | 8/2002 | Trivedi | |
| 6,465,298 B2 | 10/2002 | Forbes | |
| 6,492,227 B1 | 12/2002 | Wang | |
| 6,709,924 B1 | 3/2004 | Yu | |
| 6,962,852 B2 | 11/2005 | Ding | |
| 6,995,060 B2 | 2/2006 | Ding | |
| 7,091,091 B2 * | 8/2006 | Ding | 438/265 |
| 7,248,034 B2 | 7/2007 | Watanabe | |
| 2003/0030089 A1 * | 2/2003 | Sumino et al. | 257/298 |
| 2003/0100167 A1 | 5/2003 | Shimizu | |
| 2006/0108647 A1 | 5/2006 | Yuan | |

FOREIGN PATENT DOCUMENTS

KR 10-1999-0025205 A 4/1999

OTHER PUBLICATIONS

Heo, et al., "The P-SOG Filing Shallow Trench Isolation Technology for sub-70nm Device," Samsung Electronics Co., Ltd., Korea, 2 pgs., 2003 Symposium on VLSI Technology Digest of Technical Papers.
Park, et al., "A 70nm NOR Flash Technology with 0.049 μm2 Cell Size," Samsung Electronics Co., Ltd., Korea, pp. 238-239, 2004 Symposium on VLSI Technology Digest of Technical Papers.
Park, et al., "8Gb MLC (Multi-Level Cell) NAND Flash Memory using 63 nm Process Technology," Samsung Electronics Co., Ltd, Korea, pp. 873-876, 2004 IEEE.
PCT International Search Report, dated Mar. 25, 2009, PCT Appl. PCT/US2008/075513, filed Sep. 5, 2008.
Written Opinion of the International Searching Authority dated Mar. 25, 2009, PCT Appl. PCT/US2008/075513, filed Sep. 5, 2008.
English Abstract of Korean Patent Application 10-1999-0025205, published Apr. 6, 1999.

* cited by examiner

*Primary Examiner* — Edward Wojciechowicz
(74) *Attorney, Agent, or Firm* — Vierra Magen Marcus & DeNiro LLP (57) ABSTRACT

Shallow trench isolation regions are positioned between NAND strings (or other types of non-volatile storage). These isolation regions include sections that form concave cut-out shapes in the substrate for the NAND string (or other types of non-volatile storage). The floating gates (or other charge storage devices) of the NAND strings hang over the sections of the isolation region that form the concave cut-out shape in the substrate. To manufacture such a structure, a two step etching process is used to form the isolation regions. In the first step, isotropic etching is used to remove substrate material in multiple directions, including removing substrate material underneath the floating gates. In the second step, anisotropic etching is used to create the lower part of the isolation region.

21 Claims, 12 Drawing Sheets

NON-VOLATILE STORAGE WITH SUBSTRATE CUT-OUT AND PROCESS OF FABRICATING

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory typically utilize a charge storage region that is positioned above and insulated from a channel region in a semiconductor substrate. The charge storage region is positioned between source and drain regions. A control gate is provided over and insulated from the charge storage region. The threshold voltage of the transistor is controlled by the amount of charge that is retained in the charge storage region. That is, the minimum amount of voltage that must be applied to the control gate before the transistor is turned on to permit conduction between its source and drain is controlled by the level of charge in the charge storage region.

Figure 1:
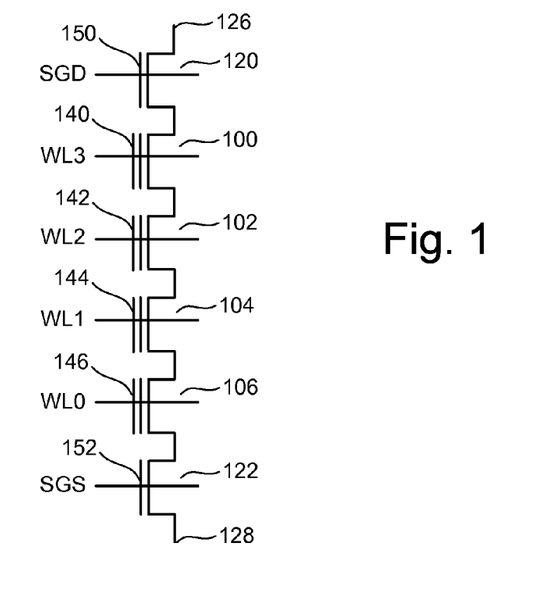
FIG. 1 is a top view of a NAND string.
Figure 2:
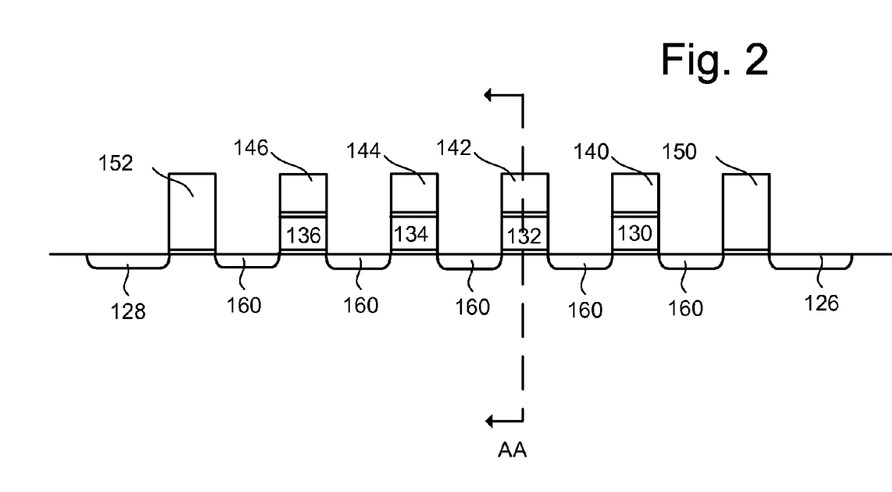
FIG. 2 is a cross sectional view of the NAND string.

One example of a flash memory system uses the NAND structure, which includes arranging multiple transistors in series, sandwiched between two select gates. The transistors in series and the select gates are referred to as a NAND string. FIG. 1 is a circuit diagram of one NAND string and FIG. 2 is a cross sectional view of the NAND string. The NAND string depicted in FIGS. 1 and 2 includes four transistors 100, 102, 104 and 106 in series and sandwiched between a first (or drain) select gate 120 and a second (or source) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate that form a floating gate stack. For example, transistor 100 has control gate 140 and floating gate 130. Transistor 102 includes control gate 142 and a floating gate 132. Transistor 104 includes control gate 144 and floating gate 134. Transistor 106 includes a control gate 146 and a floating gate 136. Control gate 140 is connected to word line WL3, control gate 142 is connected to word line WL2, control gate 144 is connected to word line WL1, and control gate 146 is connected to word line WL0. Each of the transistors (100, 102, 104, 106) of the NAND string are created on a common P-well. In some embodiments, the word lines are the control gates. Each of the transistors 100, 102, 104, 106 of the NAND have source and drain regions. For example, as depicted in FIG. 2, between each of the floating gate stacks are source/drain regions 160.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

Although FIGS. 1 and 2 show the transistors/memory cells of the NAND string having floating gates, in some embodiments other types of charge storage layers can be used. One example of a charge storage layer other than a floating gate is a charge trapping layer made from silicon nitride ("nitride"), or other suitable material.

When reading a flash memory device, such as a NAND flash memory device, a reference voltage is applied to the control gate and it is determined whether the transistor turns on. If the transistor turns on, then the threshold voltage is less than the reference voltage. The reference voltage typically corresponds to a demarcation between programmed and not programmed, or between different programmed states. More details about reading and programming flash memory can be found in U.S. Patent Application Publication 20070206426, incorporated herein by reference in its entirety.

Figure 3:
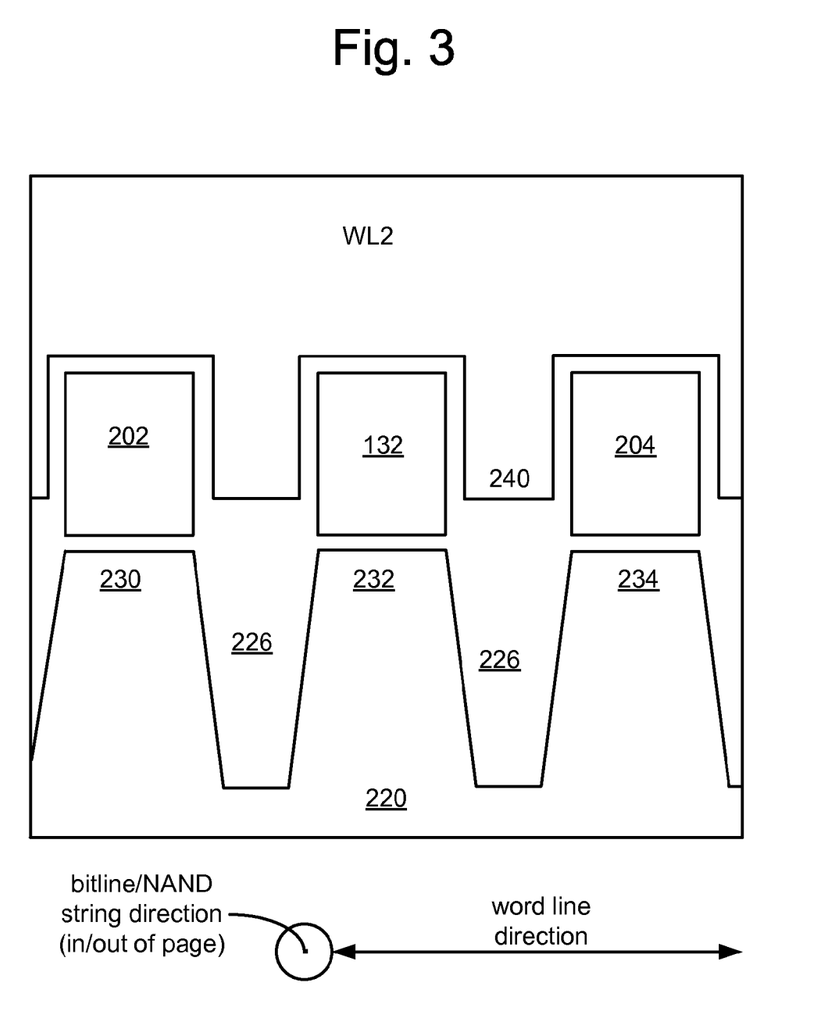
FIG. 3 is a cross sectional view of multiple NAND strings.

Interference from neighboring devices or areas can cause an error when reading data stored in non-volatile storage. This interference will be explained with respect to FIG. 3, FIG. 3 is a cross sectional view of three NAND strings, where the cross section is taken along the line AA of FIG. 2. Thus, FIG. 3 depicts a view along the word line direction (see arrow), with the bit line direction being in and out of the page. The first NAND string depicted in FIG. 3 includes channel 230, floating gate 202 and WL2. The second NAND string depicted in FIG. 3 includes channel 232, floating gate 132 and WL2. The third NAND string depicted in FIG. 3 includes channel 234, floating gate 204 and WL2.

Three sources of interference can negatively effect read operations. First, charge on floating gate 204 can effect the current in channel 232. Second, current flowing or charge existing in channel 234 can effect the current in channel 232. Third, if the lower portion 240 of Word Line WL2 is close enough to channel 232, then charge on WL2 can effect the current in channel 232. All three of these effects on the current in channel 232 can cause an error when reading data stored in floating gate 132.

SUMMARY

A non-volatile storage device is disclosed with a structure that can reduce the interference discussed above. A process for fabricating that non-volatile storage device is also explained.

One embodiment of a method of fabricating non-volatile storage includes forming active areas and forming an isolation region between the active areas. The forming of the isolation region includes performing isotropic etching to form a first section of the isolation region and performing anisotropic etching to form a second section of the isolation region.

One embodiment of a method of fabricating non-volatile storage includes forming active areas on a substrate and forming an isolation region between the active areas. The forming of the isolation region includes removing substrate material in horizontal and vertical directions to form a first section of the isolation region and removing substrate material in the vertical direction to form a second section of the isolation region.

One embodiment of a method of fabricating non-volatile storage includes forming device stacks on a substrate and forming isolation regions between the device stacks by removing substrate material under and between the device stacks.

One embodiment of a method of fabricating non-volatile storage includes adding tunnel dielectric material to a substrate, adding floating gate material on top of the tunnel dielectric, removing at least a subset of the floating gate material to form NAND strings, protecting floating gate material that has not been removed, performing isotropic etching to form first sections of isolation regions between NAND strings, performing anisotropic etching to form second sections of said isolation regions between NAND strings, filling the isolation regions, adding inter-gate dielectric material, adding control gate material on top of the inter-gate dielectric material, removing some of the control gate material to form word lines, and implanting the substrate to create source/drain regions.

One embodiment of a non-volatile storage device includes a first active area including a first substrate region and a first charge storage layer, a second active area including a second substrate region and a second charge storage layer, and an isolation region between the first substrate region and the second substrate region. The isolation region includes a first section that forms a concave cut-out shape in the first substrate region. The isolation region includes a second section that forms a concave cut-out shape in the second substrate region. The first charge storage region hangs over the first section. The second charge storage region hangs over the second section.

One embodiment of a non-volatile storage device includes a set of NAND strings. Each of the NAND strings is formed on a substrate and includes floating gates. The non-volatile storage device further includes isolation regions in the substrate and between the NAND strings. The isolation regions include sections that form concave shapes in the substrate. The floating gates hang over the sections of the isolation region that form concave shapes in the substrate.

One embodiment of a non-volatile storage device includes a first substrate region having a first top surface, a first lower dielectric layer on the first top surface, a first floating gate layer on the first lower dielectric layer, a first upper dielectric layer on the first floating gate layer, a first control gate layer on the first upper dielectric layer, a second substrate region having a second top surface, a second lower dielectric layer on the second top surface, a second floating gate layer on the second lower dielectric layer, a second upper dielectric on the second floating gate layer, a second control gate layer on the second upper dielectric layer, and an isolation region between the first substrate region and the second substrate region. A first portion of the isolation region forms a concave shape in the first substrate region. A second portion of the isolation region forms a concave shape in the second substrate region. The first charge storage layer overhangs the first portion of the isolation region. The second charge storage layer overhangs the second portion of the isolation region.

DETAILED DESCRIPTION

Figure 4:
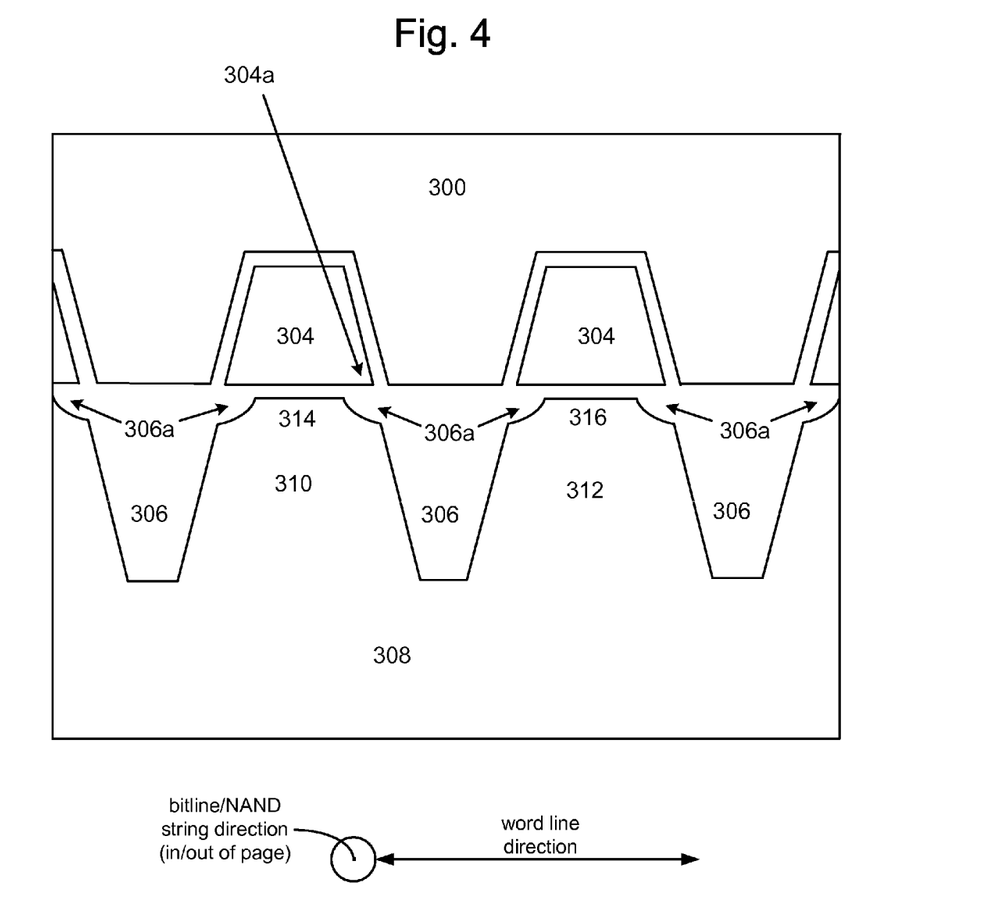
FIG. 4 is a cross sectional view of multiple NAND strings.

FIG. 4 is a cross-sectional view of two NAND strings, similar to the cross-sectional view of FIG. 3. However the NAND strings depicted in FIG. 4 include isolation regions having sections that form concave cut-out shapes in the substrate for the NAND strings. Additionally, the floating gates overhang these sections that form concave cut-out shapes.

FIG. 4 shows a substrate 308 that has multiple active regions. For example, FIG. 4 depicts active region 310 of substrate 308 and active region 312 of substrate 308. Between the active regions of the substrate are isolation regions 306. NAND strings are formed on each of the active regions. For example a first NAND string is formed on (and including) active region 310. A second NAND string is formed on (an including) active region 312. A common word line 300 forms the control gate for both NAND strings. The common word line 300 wraps around the top and two sides of the floating gates. There are dielectric regions between the floating gates and the word line, as well as between the floating gates and the substrate. As depicted, floating gates 304 are wider on the bottom and narrower on the top. Each of the isolation regions 306 includes two sections 306a that form concave cut-out shapes in the active regions (e.g. 310 and 312) of the substrate. Floating gates 304 hang over sections 306a. Each of the NAND strings includes a channel region (see e.g., 314 and 316) in the substrate. Each NAND string (which includes an active region of the substrate, a first dielectric layer, a floating gate layer, a second dielectric layer, and a control gate layer) forms an active area of the memory device. In other types of non-volatile memory, the active areas (the areas that store the data) of the memory device can be formed of different components than that of the NAND string.

The portion 304a of the floating gates that overhangs the sections 306a of the isolation region create a fringe electric field in proximity to that corner of the floating gate. This fringe electric field shields the channel (314 and 316) from coupling due to a neighboring control gate, neighboring floating gate, or neighboring channel. Additionally, this fringe electric field makes the associated floating gate dominate as compared to capacitances from neighbor structures. For example, FIG. 4 shows corner 304a of floating gate 304. This corner 304a is responsible for a fringe electric field in proximity to corner 304a. This fringe electric field makes floating gate 304 dominate over channel 314 and partially shields channel 314 from unwanted capacitive effects from neighboring channel 316 and neighboring floating gates. It also allows the associated floating gate of the same NAND string to be dominate over channel 314 with respect to control gate/word line 300. Similar analysis applies to the other corners of other floating gates. Note that although FIG. 4 shows only two NAND strings, the above described structure and effects would apply to all the NAND strings of a flash memory array, including all the NAND strings connected to a common word line as well as all of the memory elements on those NAND strings.

Figure 5:
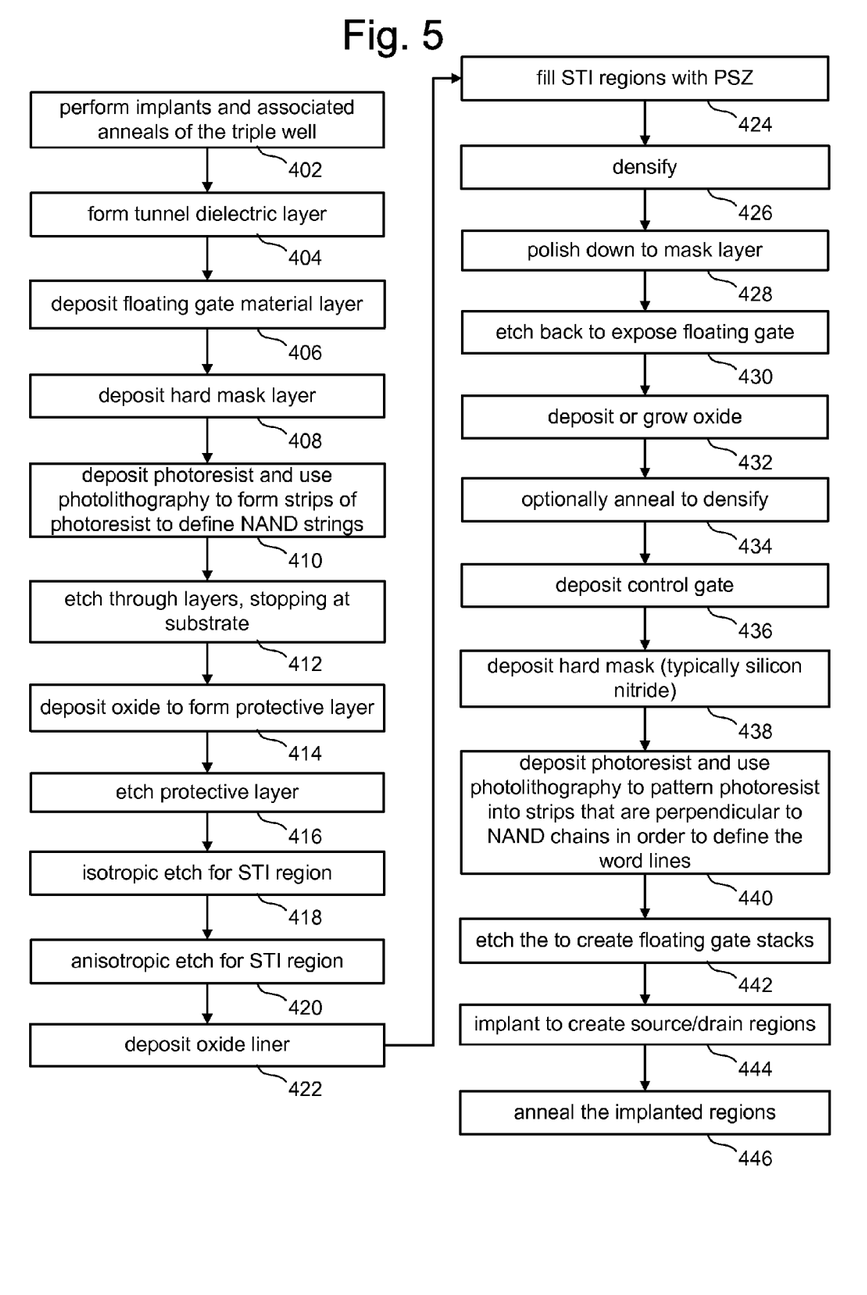
FIG. 5 is a flow chart for fabricating non-volatile storage.

FIG. 5 is a flowchart describing one embodiment of the front end process for manufacturing non-volatile storage according to the embodiment of FIG. 4. The process of FIG. 5 can also be used to manufacture other structures. The flowchart of FIG. 5 does not cover any optional booster plates or fins, or forming contacts, metallizations, via passivation, etc. While a flash memory will consist of both peripheral circuitry (which includes a variety of low, medium and high voltage transistors) and the core memory array, the process steps of FIG. 5 are intended only to describe in general terms possible processes for fabrication of the core memory array. Many photolithography, etch, implant, diffusion, and oxidation steps that are intended for fabrication of peripheral transistors are omitted, but are well known in the art. In various embodiments, the order of steps depicted in FIG. 5 can be varied.

Figure 6A:
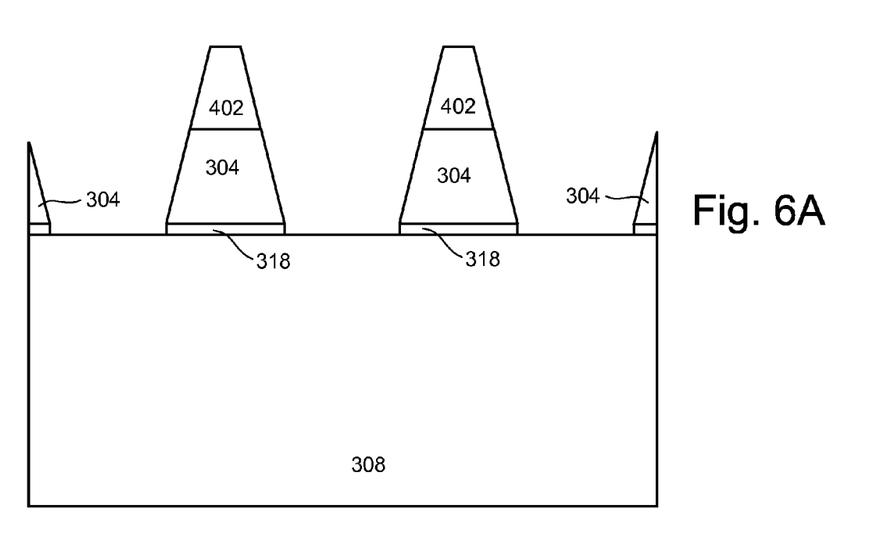
FIGS. 6A-K depicts cross sectional views of NAND strings during a fabrication process.
Figure 6B:
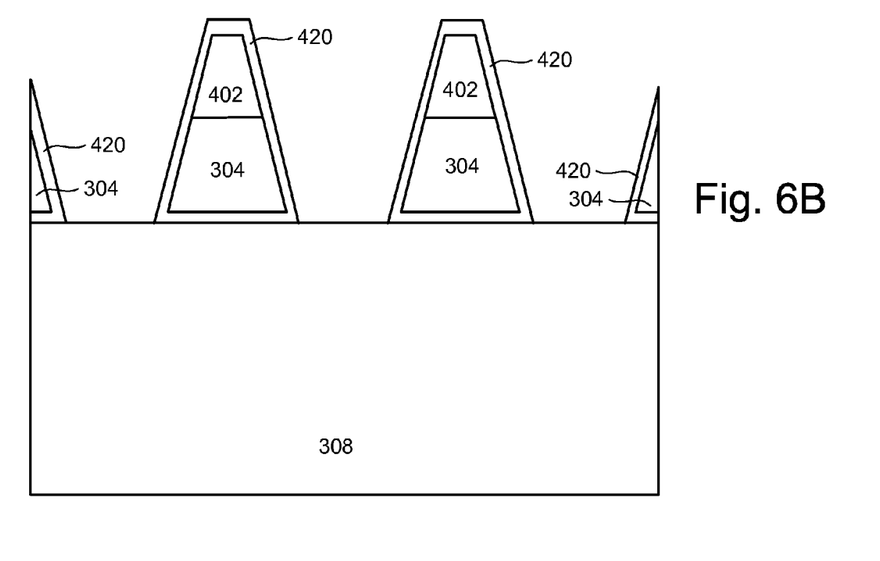
Figure 6C:
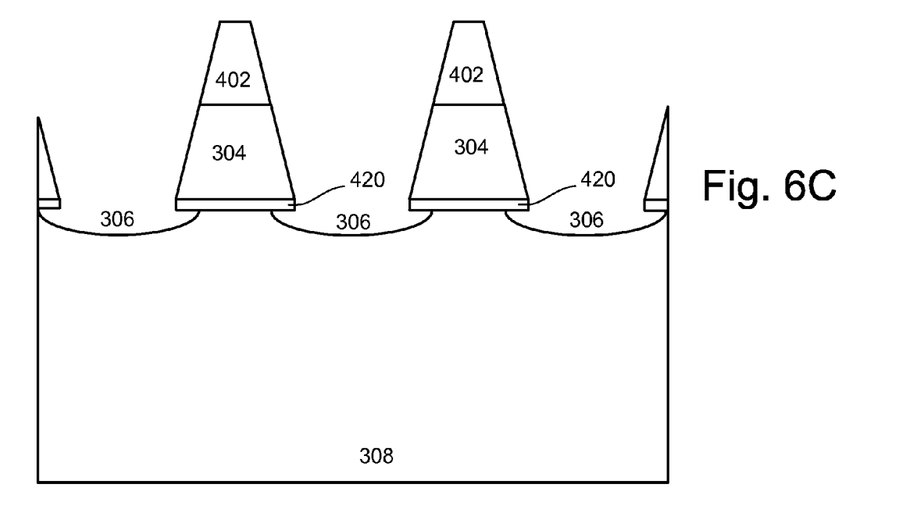
Figure 6D:
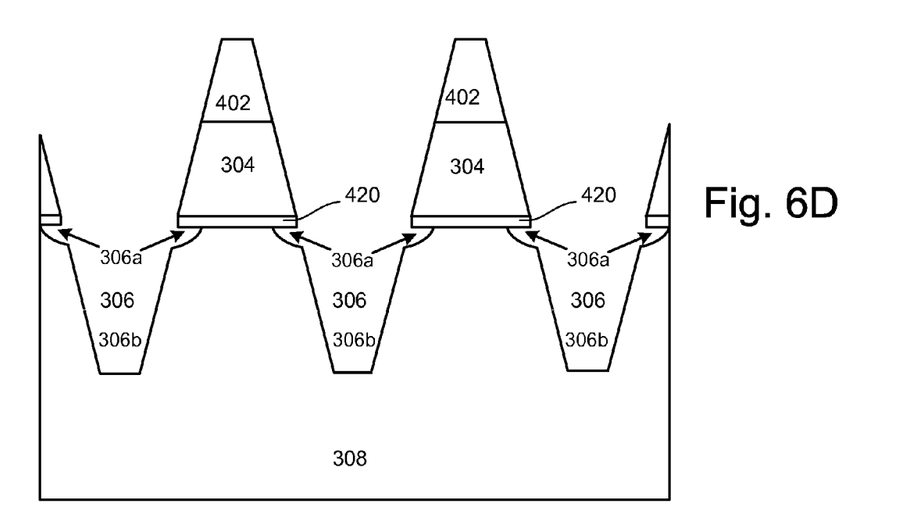
Figure 6E:
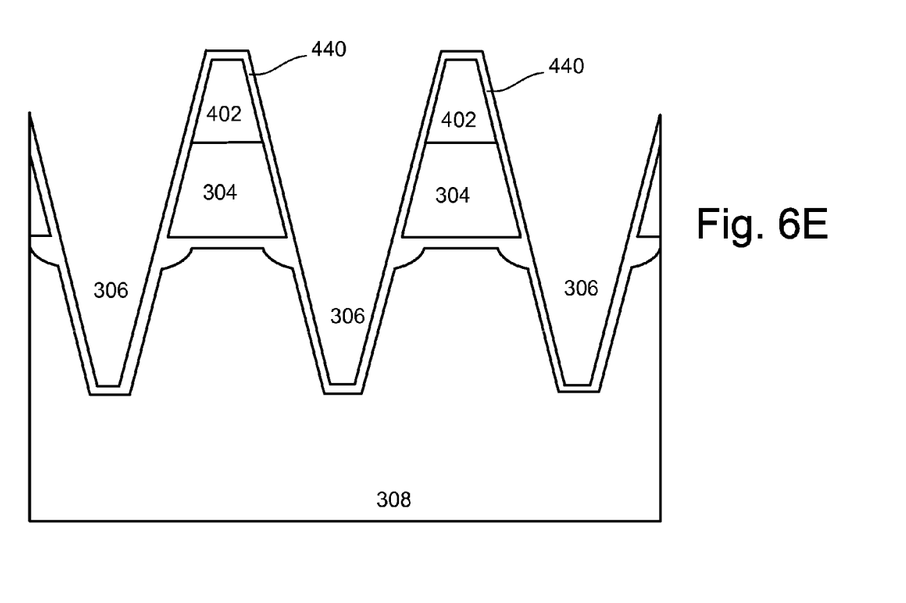
Figure 6F:
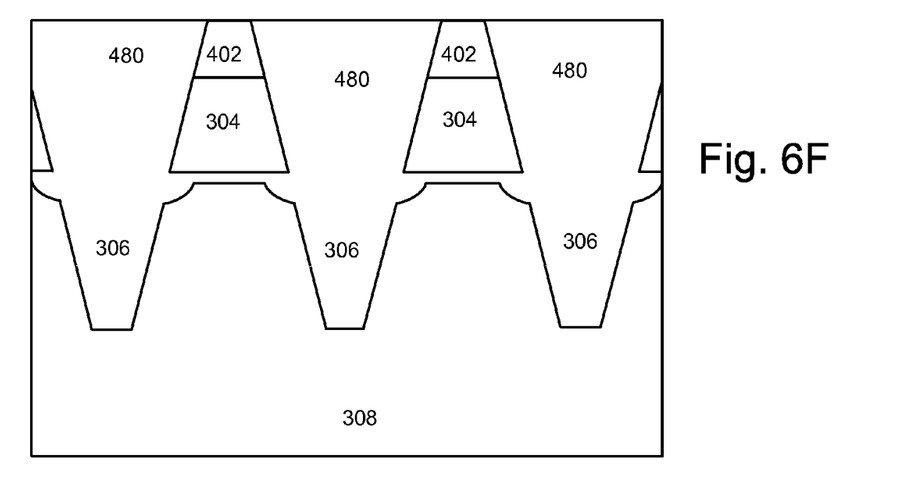
Figure 6G:
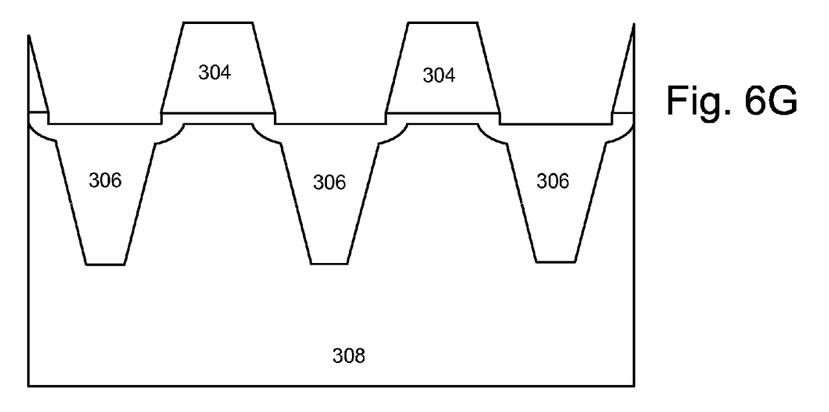
Figure 6H:
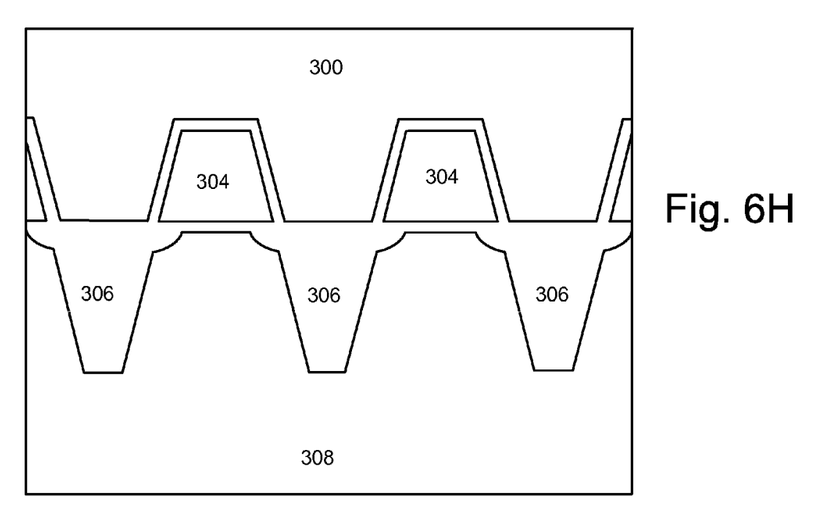
Figure 6I:
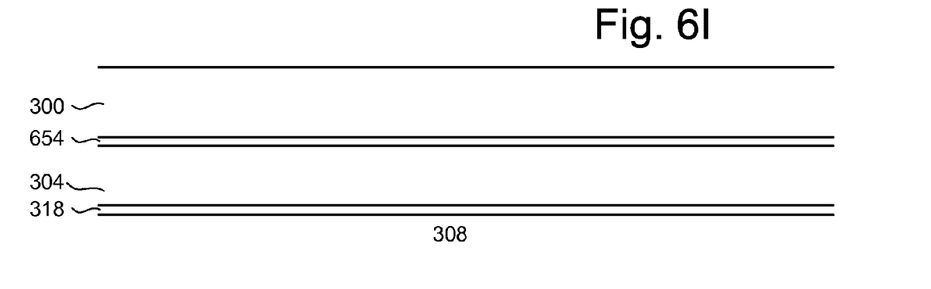
Figure 6J:
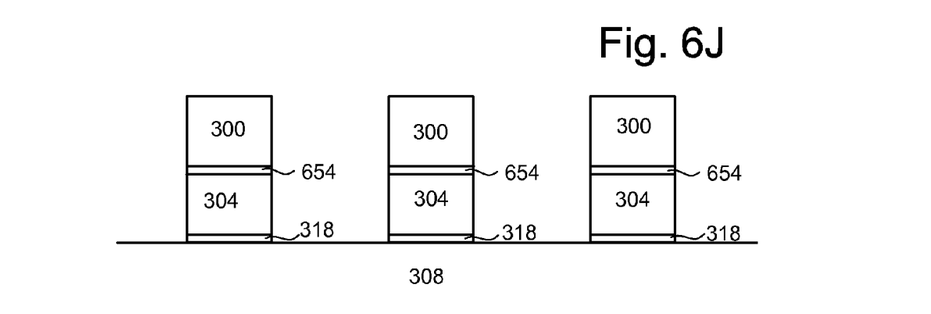
Figure 6K:
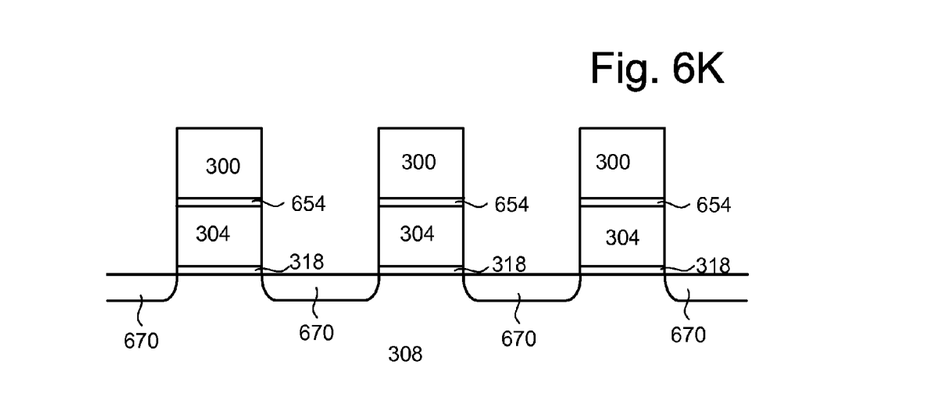

FIGS. 6A-6K will be used to help explain the process of FIG. 5. FIGS. 6A-6H are cross-sectional views (similar to the perspective of FIG. 4, which is along the word line direction) of the non-volatile storage device being manufactured at various stages of the fabrication process. Thus, FIGS. 6A-6H show multiple NAND strings. FIGS. 6I-6K are cross-sectional view of the non-volatile storage device being manufactured along the bit line direction. FIGS. 6I-6K show multiple floating gates of one NAND string.

Step 402 of FIG. 5 includes performing implants and associated anneals of the triple well. The result of step 402 includes a P-substrate, and N-well within the P-substrate, and a P-well within the N-well. Note that the P-well, N-well and P-substrate are all part of the substrate. Looking back at FIG. 4, active regions 310 and 312 are both part of the same P-well. In step 404, a tunnel dielectric layer is formed on top of the P-well. In one embodiment, an oxide layer ($SiO_2$) is grown on the top surface of the P-well. In step 106, floating gate material layer is deposited over the tunnel dielectric layer. In one embodiment, the floating gate is made of poly-silicon, and the poly-silicon is deposited over the tunnel dielectric layer using Chemical Vapor Deposition (CVD).

Step 408 includes depositing a hard mask. For example, CVD can be used to deposit $Si_3N_4$. In step 410, photolithography is used to form strips of photoresist over what will become the NAND strings. Step 412 includes etching through the layers until the substrate. In one embodiment, step 412 can include etching through part of the substrate. First, the hard mask is etched through using anisotropic plasma etching (e.g. in this step, reactive ion etching with the proper balance between physical and chemical etching for each planer layer encountered). After the hard mask layer is etched into strips, the photoresist can be stripped away and the hard mask layer can be used as a mask for etching the underlying layers. The process then includes etching through the floating gate material and the tunnel dielectric material, stopping at the substrate. FIG. 6A shows a cross-sectional view of the non-volatile storage device during the fabrication process and after the conclusion of step 412. FIG. 6A shows substrate 308. Above substrate 308 is tunnel dielectric layer 318. Above tunnel dielectric layer 318 are floating gates 304. Above floating gates 304 are hard masks 402.

In step 414, an oxide layer is deposited over the device in order to form a protective layer. This protective layer is used to protect the floating gates 304 during subsequent etching for the shallow trench isolation regions. FIG. 6B shows a cross-sectional view of the device after step 416. Note that FIG. 6B shows protective layer 420 surrounding hard masks 402 and floating gates 304.

In order to prevent neighboring NAND strings from interfering with each other, shallow trench isolation (STI) regions are formed between the NAND strings. In one embodiment, the creation of these STI regions includes a two step etching process. The first step (step 418) includes isotropically etching a first portion of the STI region. Isotropic etching is a non-directional removal of material from a substrate via a chemical process using an etchant substance. The etchant may be a corrosive liquid or a chemically active ionized gas (such as plasma). Because isotropic etching is non-directional, etching is performed in multiple directions. For example, etching will be performed in the vertical direction, the horizontal direction, and intermediate directions between horizontal and vertical. FIG. 6C is a cross-sectional view of the device after one embodiment of step 418. As can be seen, shallow trench isolation regions 306 are in the shape similar to a semicircle. In one embodiment, the isotropic etching of step 418 etches a true semicircle. In other embodiments, the isotropic etching of step 418 can create shapes similar to or different than a semicircle. FIG. 6C shows a flattened semicircle. During the process of isotropically etching of step 418, substrate material is removed from underneath the floating gates (and underneath the tunnel dielectric) and between the floating gates. This removal of the substrate material below the floating gates creates the cut-out in the substrate, where the cut-out is in a concave shape.

The second step of the two step etching process for creating the STI regions includes anisotropic etching in step 420. Anisotropic etching is directional etching. For example, the etching may be performed in a vertical direction only (with respect to the substrate). In some embodiments, step 420 includes removing substrate material in areas between the floating gates, but not beneath the floating gates. FIG. 6D shows the non-volatile storage device after the completion of step 420. As can be seen, STI regions 306 now include two sections 306a and 306b. The first section 306a was created in step 418 and the bottom section 306b was created in step 420. Section 306a has a curved profile. Section 306b has an angled profile.

In step 422, an oxide liner is deposited. For example, FIG. 6E shows oxide liner 440 deposited on top of the floating gate stacks as well as in the STI regions 306.

In step 424, the STI regions 306 are filled with Polysilazine (PSZ) which is a spin-on-glass material. In step 426, a densification process is used. Densification changes PSZ to $SiO_2$ because of a reaction of PSZ with $O_2$. The result is $SiO_2$ plus ammonia gas. The ammonia gas out diffuses. The STI region can also be filled using other methods, such as ALD, High Density Plasma (HDP), and TEOS-CVD. In step 428, Chemical Mechanical Polishing (CMP), or another suitable process, is used to polish the fill material flat until reaching the floating gate poly-silicon. In step 430, an etching process is performed to expose the floating gate. For example, FIG. 6G shows the non-volatile storage device being manufactured after the completion of step 430.

In step 432, the inter-gate dielectric (e.g. oxide) is grown or deposited using Atomic Layer Deposition (ALD), CVD, Physical Vapor Deposition (PVD), Jet Vapor Deposition (JVD), or another suitable process. In step 434, which is an optional step, the inter-gate dielectric is annealed to densify the oxide.

In step 436, one or more layers of the control gate (including the word line) are deposited on top of the inter-gate oxide. In one embodiment, the materials deposited in step 436 include poly-silicon. In other embodiments, this layer may be a metal layer with a proper work function, thermal stability and etch characteristics. In some embodiments, the control gate/word line can be composed of a poly-silicon layer, tungsten-nitride layer, and tungsten layer. These materials can be deposited in a blanket form using CVD, ALD, PVD, or other suitable process. FIG. 6H shows the device being manufactured after step 436, with control gate/word line layer 300 deposited on the inter-gate dielectric.

As explained above, FIG. 6H shows multiple NAND strings and is a cross-sectional view along the word line direction. FIG. 6I shows one NAND string after step 436 along the bit line direction. FIG. 6I shows tunnel oxide layer 318, floating gate 304, inter-gate dielectric 654 and control gate/word line layer 300.

In step 438, a hard mask of $Si_3N_4$ is deposited using, for example, CVD, on top of the control gate layer. In step 440, photolithography is used to create patterns of strips perpendicular to the NAND string, in order to etch the floating gate stack and form word lines that are isolated from one another. In step 442, etching is performed using plasma etching, ion milling, ion etching that is truly physical etching, or another suitable process to etch the various layers in forming individual word lines. In one embodiment, the etching is performed until the inter-gate dielectric is reached. In another embodiment, the process can continue to etch until the substrate is reached. FIG. 6J, which shows three floating gate stacks, depicts the device after step 442.

In step 444, an implant process is performed to create the N+source/drain regions of Arsenic implantation. Other materials can be also be used. In one embodiment, a halo implant is also used. In step 456, an anneal process is performed for the implanted regions. FIG. 6K depicts the device after step 446. As can be seen, the NAND strings includes source/drain region 670 between the floating gate stacks. Each floating gate stack includes a tunnel dielectric 318, floating gate 304, inter-gate dielectric 654 and control gate/word line 300.

There are many alternatives to the above described structures and processes within the spirit of the present invention. For example, an alternative is to fabricate the memory cells from PMOS devices with opposite polarity bias conditions for the various operations as compared to the existing NMOS implementation. The above-described methods can also be used with other technologies, such as a MONOS or SONOS approach.

Figure 7:
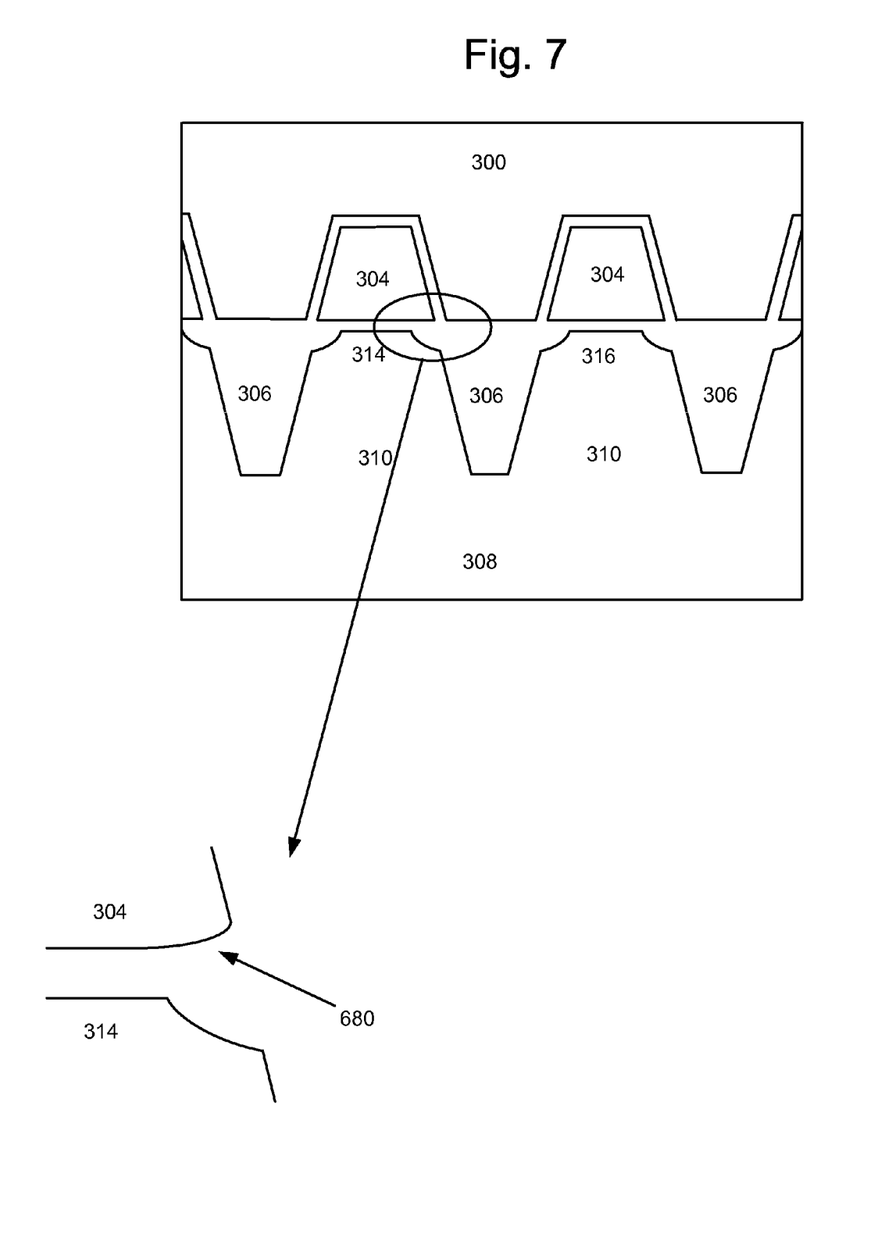
FIG. 7 is a cross sectional view of multiple NAND strings.

In the embodiments depicted in FIGS. 4-6, the bottom of the floating gate was relatively flat and has corners. In some embodiments, the ends of the bottom surface of the floating gates can be curved to exhibit what is called the bird's beak effect. FIG. 7 shows a cross-sectional view of multiple NAND strings according to the technology described herein. A close up of a portion of the corner of floating gate 304 is depicted in more detail at the bottom of FIG. 7. As can be seen, corner 680 curves up in a manner that exhibits the bird beak effect. In step 432 of FIG. 5, an oxidation step is performed. This oxidation could result in the rounding shape at the edge 680 of the floating gate due to oxidation of the polysilicon.

Figure 8:
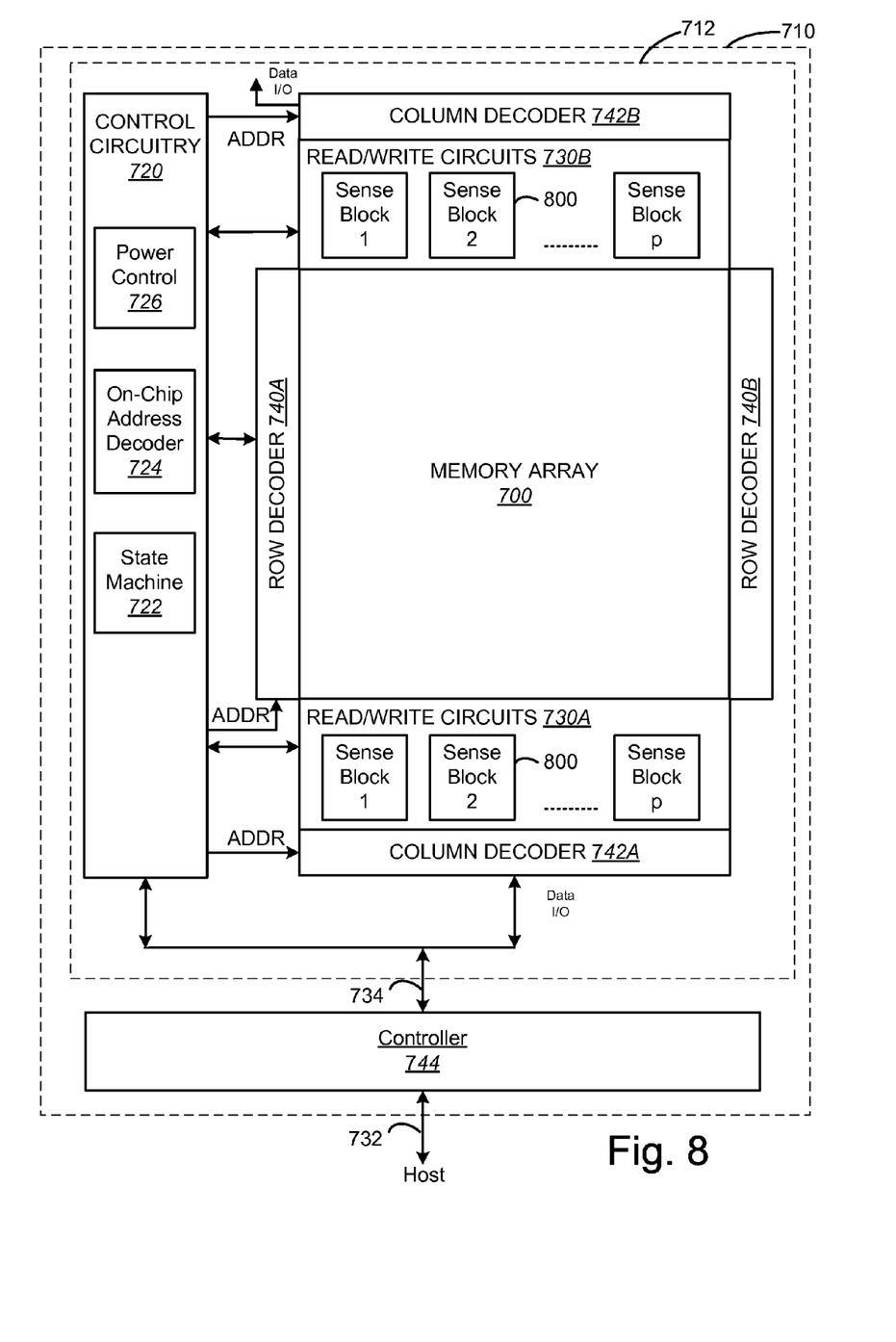
FIG. 8 is a block diagram of an example of a non-volatile storage system.

FIG. 8 illustrates a non-volatile storage system that uses the non-volatile storage elements of FIGS. 4-7. Memory device 710 includes read/write circuits for reading and programming a page (or other unit) of memory cells (e.g., NAND multi-state flash memory) in parallel. Memory device 710 may include one or more memory die or chips 712. Memory die 712 includes an array (two-dimensional or three dimensional) of memory cells 700, control circuitry 720, and read/write circuits 730A and 730B. In one embodiment, access to the memory array 700 by the various peripheral circuits is implemented in a symmetric fashion, on opposite sides of the array, so that the densities of access lines and circuitry on each side are reduced by half. The read/write circuits 730A and 730B include multiple sense blocks 800 which allow a page of memory cells to be read or programmed in parallel. The memory array 700 is addressable by word lines via row decoders 740A and 740B and by bit lines via column decoders 742A and 742B. Word lines and bit lines are examples of control lines. In a typical embodiment, a controller 744 is included in the same memory device 710 (e.g., a removable storage card or package) as the one or more memory die 712. Commands and data are transferred between the host and controller 744 via lines 732 and between the controller and the one or more memory die 712 via lines 734.

Control circuitry 720 cooperates with the read/write circuits 730A and 730B to perform memory operations on the memory array 700. The control circuitry 720 includes a state machine 722, an on-chip address decoder 724 and a power control module 726. The state machine 722 provides chip-level control of memory operations. The on-chip address decoder 724 provides an address interface between that used by the host or a memory controller to the hardware address used by the decoders 740A, 740B, 742A, and 742B. The power control module 726 controls the power and voltages supplied to the word lines and bit lines during memory operations. In one embodiment, power control module 726 includes one or more charge pumps that can create voltages larger than the supply voltage.

In one embodiment, one or any combination of control circuitry 720, power control circuit 726, decoder circuit 724, state machine circuit 722, decoder circuit 742A, decoder circuit 742B, decoder circuit 740A, decoder circuit 740B, read/write circuits 730A, read/write circuits 730B, and/or controller 744 can be referred to as one or more managing circuits. The one or more managing circuits perform the processes for erasing, programming and reading.

Figure 9:
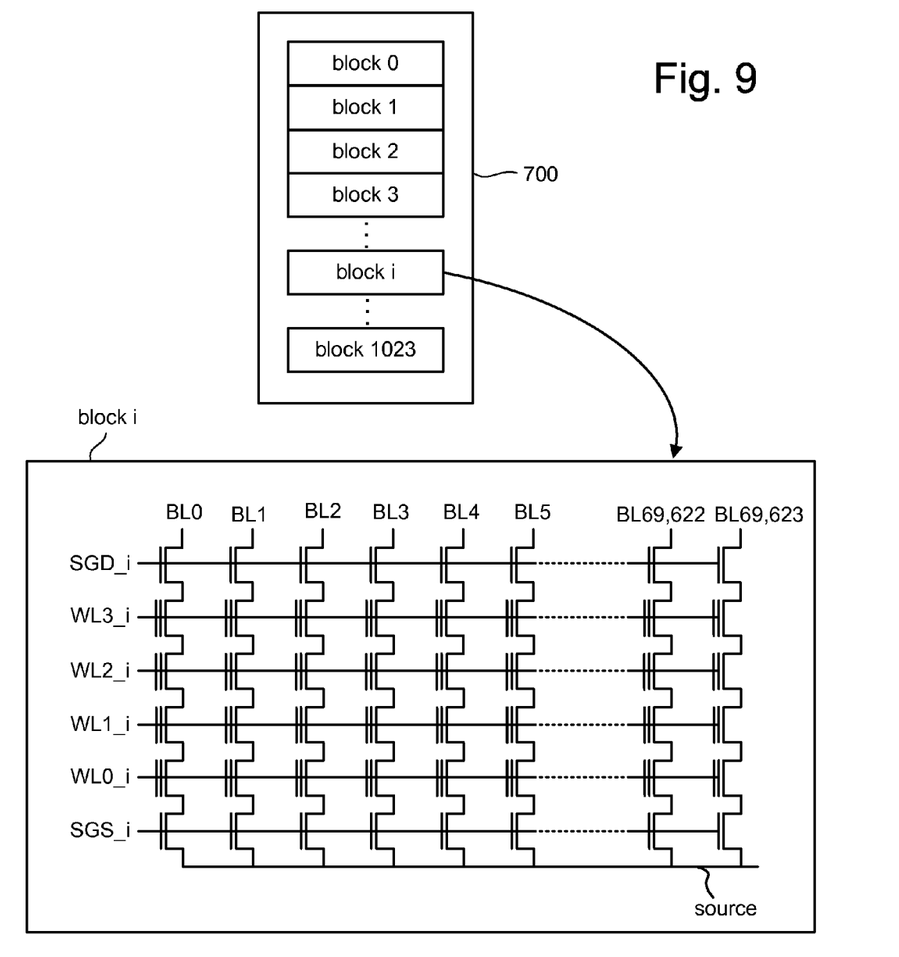
FIG. 9 is a block diagram of an example of a memory array that can be used in a non-volatile storage system.

FIG. 9 depicts an exemplary structure of memory cell array 700. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used.

A block contains a set of NAND stings which are accessed via bit lines (e.g., bit lines BL0-BL69623) and word lines (WL0, WL1, WL2, WL3). The NAND strings are manufactured using the process of FIG. 5 and FIG. 6A-6K. The NAND strings have the structure depicted in FIG. 4 and/or FIG. 7.

FIG. 9 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. Thus, in one embodiment, the set of memory cells that are connected to a common word line are programmed simultaneously. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Programming the NAND flash memory described herein typically includes applying a program voltage to the control gates of the selected memory cells by applying that programming voltage to the corresponding word line. The bit line is grounded. Electrons from the channel are injected into the floating gate (charge storage layer). For example, Fowler-Nordheim tunneling can be used. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory," incorporated herein by reference in its entirety. Note that in many embodiments, the program voltage is applied to the word line as a series of pulses, with each successive pulse being higher in magnitude than a previous pulse by a step size. Between each pulse, a set of one or more verify operations are performed to determine whether the programming has completed.

In general, during verify operations and read operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. By testing the memory cell at one or more levels, it can be determined whether the memory cell is programmed or erased, or which state a memory cell is in (with respect to multiple program states).

There are many ways to measure the conduction current of a memory cell during a read or verify operation. In one example, the conduction current of a memory cell is measured by the rate it discharges or charges a dedicated capacitor in a sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

In one embodiment, memory cells are erased by raising the p-well to an erase voltage (e.g., 20 volts) for a sufficient period of time and grounding the word lines of a selected block while the source and bit lines are floating. Due to capacitive coupling, the unselected word lines, bit lines, select lines, and source line are also raised to a significant fraction of the erase voltage. A strong electric field is thus applied to the tunnel oxide layers of selected memory cells and the data of the selected memory cells are erased as electrons of the floating gates are emitted to the substrate, typically by a Fowler-Nordheim tunneling mechanism. As electrons are transferred from the floating gate to the p-well region, the threshold voltage of a selected cell is lowered. Erasing can be performed on the entire memory array, separate blocks, or another unit of cells. After the block of memory cells is erased, the various memory cells can be programmed or partially programmed The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device, comprising:
a first active area including a first substrate region and a first floating gate, said first floating gate includes a lowest surface;
a second active area including a second substrate region and a second floating gate, said second floating includes a lowest surface; and
an isolation region between said first substrate region and said second substrate region, said isolation region includes a first section that forms a concave cut-out shape in said first substrate region, said isolation region includes a second section that forms a concave cut-out shape in said second substrate region, said lowest surface of said first floating gate hangs over said first section, said lowest surface of said second floating gate hangs over said second section.

2. A non-volatile storage device according to claim 1, wherein:
said lowest surface of said first floating gate is positioned higher than said isolation region in its entirety.

3. A non-volatile storage device according to claim 2, further comprising:
a word line, said word line having a lowest surface that is at a same level as said lowest surface of said first floating gate and said lowest surface of said second floating gate.

4. A non-volatile storage device according to claim 1, wherein:
said concave cut-out shape in said second substrate region is formed from horizontal isotropic etching underneath said second floating gate while said second floating gate was in place.

5. A non-volatile storage device according to claim 1, wherein:
said first active area is a first NAND string;
said second active area is a second NAND string;
said isolation region is filled with a dielectric; and
said first NAND string, said second NAND string and said isolation region are in a common well.

6. A non-volatile storage device according to claim 1, wherein:
said first active area includes a channel in said first substrate region, a tunnel dielectric layer above said channel, a set of floating gates above said tunnel dielectric layer, a set of control gates, and an inter-gate dielectric layer between said floating gates and said control gates; and
said set of floating gates includes said first floating gate.

7. A non-volatile storage device according to claim 1, wherein:
said isolation region includes a third section that includes all of said isolation region other than said first section and said second section; and
said lowest surface of said first floating gate and said lowest surface of said second floating gate do not hang over said third section of said isolation region.

8. A non-volatile storage device according to claim 1, wherein:
said first floating gate and said second floating gate are narrower on top and wider on bottom.

9. A non-volatile storage device, comprising:
a set of NAND strings, each of said NAND strings is formed on a substrate and includes floating gates, each floating gate has a lowest surface; and
isolation regions in said substrate and between said NAND strings, said isolation regions include sections that form concave shapes in said substrate, said lowest surfaces of said floating gates hang over said sections of said isolation region that form concave shapes in said substrate, said lowest surfaces of said floating gates are positioned above said isolation regions in their entirety.

10. A non-volatile storage device according to claim 9, wherein:
said sections of said isolation regions that form concave shapes in said substrate have rounded profiles;
said isolation regions each include a main section that includes all of a respective isolation region other than said sections that form concave shapes in said substrate; and
said lowest surface of said floating do not hang over said main sections of said isolation regions.

11. A non-volatile storage device according to claim 10, wherein:
said concave shapes are formed from horizontal isoptropic etching underneath said floating gates while said floating gates are in place.

12. A non-volatile storage element according to claim 11, wherein:
each of said NAND strings includes a channel in said substrate, a tunnel dielectric layer above said channel such that said floating gates are positioned above said tunnel dielectric layer, a set of control gates, and a inter-gate dielectric layer between said floating gates and said control gates.

13. A non-volatile storage device according to claim 12, wherein:
said floating gates are narrower on top and wider on bottom, said bottom is closer to said substrate than said top.

14. A non-volatile storage device, comprising:
a first substrate region having a first top surface;
a first lower dielectric layer on said first top surface;
a first floating gate on said first lower dielectric layer;
a first upper dielectric layer on said first floating gate;
a first control gate layer on said first upper dielectric layer;
a second substrate region having a second top surface;
a second lower dielectric layer on said second top surface;
a second floating gate on said second lower dielectric layer;
a second upper dielectric on said second floating gate;
a second control gate layer on said second upper dielectric layer; and
an isolation region between said first substrate region and said second substrate region, a first portion of said isolation region forms a concave cut-out in said first substrate region, a second portion of said isolation region forms a concave cut-out in said second substrate region, said isolation region includes a third portion that includes all of said isolation region except said first portion and said second portion, said first floating gate overhangs said first portion of said isolation region without overhanging said third portion of said isolation region, said second floating gate overhangs said second portion of said isolation region without overhanging said third portion of said isolation region.

15. A non-volatile storage device according to claim 14, wherein:
said first portion of said isolation region and said second portion of said isolation region are formed from horizontal isotropic etching underneath said first and second floating gates while said first and second floating gates are in place.

16. A non-volatile storage device according to claim 14, wherein:
said first floating gate and said second floating gate are narrower on top and wider on bottom;
said second control gate layer is above said second upper dielectric layer and on two sides of said second floating gate.

17. A non-volatile storage device according to claim 16, wherein:
said first floating gate and said second floating gate are positioned higher than said isolation region in its entirety.

18. A non-volatile storage device according to claim 17, wherein:
said first substrate region, said first lower dielectric layer, said first floating gate, said first upper dielectric layer and said first control gate layer comprise a first NAND string;
said second substrate region, said second lower dielectric layer, said second floating gate, said second upper dielectric layer and said second control gate layer comprise a second NAND string;
said isolation region is filled with a dielectric; and
said first NAND string, said second NAND string and said isolation region are in a common well.

19. A non-volatile storage device according to claim 17, wherein:
said first floating gate and said second floating gate have bottom surfaces;
said bottom surface of said first floating gate hangs over said first section of said isolation region; and
said bottom surface of said second floating gate hangs over said second section of said isolation region.

20. A non-volatile storage device according to claim 14, wherein:
said first floating gate has a bottom surface in contact with said first lower dielectric layer;
said second floating gate has a bottom surface in contact with said second lower dielectric layer;
said bottom surface of said first floating gate overhangs said first portion of said isolation region; and
said bottom surface of said second floating gate overhangs said second portion of said isolation region.

21. A non-volatile storage device, comprising:
a first substrate region having a first top surface;
a first lower dielectric layer on said first top surface;
a first floating gate layer on said first lower dielectric layer, said first floating gate layer has a bottom surface in contact with said first lower dielectric layer;
a first upper dielectric layer on said first floating gate layer;
a first control gate layer on said first upper dielectric layer;
a second substrate region having a second top surface;
a second lower dielectric layer on said second top surface;
a second floating gate layer on said second lower dielectric layer, said second floating gate layer has a bottom surface in contact with said second lower dielectric layer;
a second upper dielectric on said second floating gate layer;
a second control gate layer on said second upper dielectric layer; and
an isolation region between said first substrate region and said second substrate region, a first portion of said isolation region forms a cut-out in said first substrate region, a second portion of said isolation region forms a cut-out in said second substrate region, said bottom surface of said first floating gate layer overhangs said first portion of said isolation region, said bottom surface of said second floating gate layer overhangs said second portion of said isolation region.

* * * * *